(12) United States Patent
Kim et al.

(10) Patent No.: US 8,508,056 B2
(45) Date of Patent: Aug. 13, 2013

(54) HEAT RELEASING SEMICONDUCTOR PACKAGE, METHOD FOR MANUFACTURING THE SAME, AND DISPLAY APPARATUS INCLUDING THE SAME

(75) Inventors: Sung-Jin Kim, Suwon-si (KR); Jun-Il Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 346 days.

(21) Appl. No.: 12/813,229

(22) Filed: Jun. 10, 2010

(65) Prior Publication Data
US 2010/0314637 A1 Dec. 16, 2010

(30) Foreign Application Priority Data

Jun. 16, 2009 (KR) .................. 10-2009-0053190
Dec. 18, 2009 (KR) .................. 10-2009-0126579

(51) Int. Cl.
H01L 23/34 (2006.01)

(52) U.S. Cl.
USPC .............. 257/796; 257/E33.06; 257/E23.101

(58) Field of Classification Search
USPC ............. 257/796, E33.06, E33.075, E23.101
See application file for complete search history.

(56) References Cited

U.S. PATENT DOCUMENTS

| 5,315,480 | A  | * | 5/1994  | Samarov et al. ............ 361/705 |
| 7,205,718 | B2 | * | 4/2007  | Cok .............................. 313/512 |
| 7,262,511 | B2 | * | 8/2007  | Osako et al. ................ 257/783 |
| 2006/0274252 | A1 |  | 12/2006 | Son |
| 2008/0023822 | A1 |  | 1/2008  | Lee et al. |
| 2009/0091021 | A1 | * | 4/2009  | Nakamura .................. 257/707 |
| 2009/0273076 | A1 |  | 11/2009 | Choi et al. |

FOREIGN PATENT DOCUMENTS

| KR | 10-2003-0080900 A | 10/2003 |
| KR | 10-0771890        | 11/2007 |
| KR | 10-2008-0088140   | 10/2008 |

* cited by examiner

*Primary Examiner* — Wensing Kuo
(74) *Attorney, Agent, or Firm* — Sherr & Jiang, PLLC

(57) ABSTRACT

A heat releasing semiconductor package, a method for manufacturing the same, and a display apparatus including the same. The heat releasing semiconductor package includes a film, an electrode pattern formed over the film, a semiconductor device mounted over the electrode pattern, and a first heat releasing layer formed over the semiconductor device including the electrode pattern, the first heat releasing layer including a first adhesive and a first heat releasing material.

16 Claims, 7 Drawing Sheets

Figure 1A:
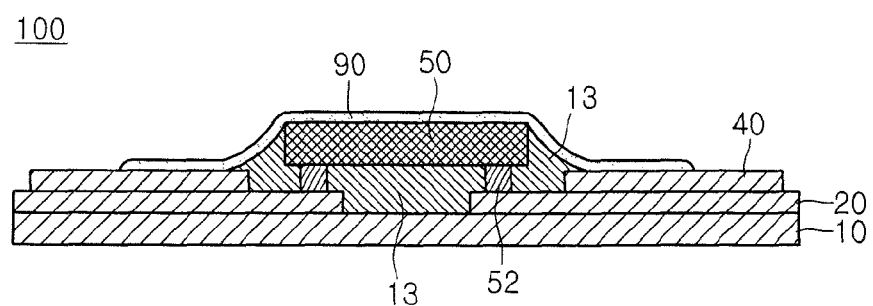

HEAT RELEASING SEMICONDUCTOR PACKAGE, METHOD FOR MANUFACTURING THE SAME, AND DISPLAY APPARATUS INCLUDING THE SAME

The present application claims priority under 35 U.S.C. §119 to Korean Patent Application Nos. 10-2009-0053190 (filed Jun. 16, 2009) and 10-2009-0126579 (Dec. 18, 2009), which are hereby incorporated by reference in their respective entireties.

BACKGROUND

Generally, it is required that heat generated from a drive integrated circuit (IC) for a display apparatus is transferred to the outside to prevent thermal loss of a product provided with the drive IC. Such a display apparatus may include, for example, a liquid crystal display (LCD), a plasma display panel (PDP), an organic light-emitting diode (OLED), and the like.

An LCD may display an image by controlling light transmittance of liquid crystal using an electric field. For displaying the image, the LCD may be provided with a liquid crystal panel including a plurality of liquid crystal cells arranged in a matrix configuration, and a drive circuit for driving the liquid crystal panel. The LCD may be miniaturized, compared with a cathode ray tube (CRT), and thus, can be commercialized as a display apparatus, such as a portable television, a lap-top personal computer, etc.

A data driver and a gate driver are integrated in a plurality of integrated circuits. Each of the integrated data driver IC and gate driver IC is mounted on a tape carrier package (hereinafter, referred to as "TCP"). The integrated data driver IC and gate driver IC is connected to the liquid crystal panel in a tape automated bonding (TAB) method. Alternatively, the integrated data driver IC and gate driver IC is mounted on the liquid crystal panel using a chip-on-glass (COG) method. The driver IC and the data driver IC as combined is called a drive IC.

Particularly, due to appearance of a high resolution display and appearance of a high integration IC for cost reduction, heat generation of ICs has raised a serious issue. The heat generation has an influence on the stability of the circuit and may threaten heat resistance temperature of a flexible base film.

A method of attaching a tape for reducing heat generation of the drive IC needs an additional process and subsidiary materials. Also, a thin metal heat releasing sheet such as aluminum (Al) is attached, but cannot be applied to a subject having an irregular surface. Also, the thin metal heat releasing sheet has a limitation in decreasing the thickness thereof, and a difficulty in manufacturing the same.

Moreover, in cases where the thin metal heat releasing sheet is attached, it may be necessary to use separate laminating equipment. It may also be necessary to manufacture and supply the thin metal heat releasing sheet to be matched to the subject's requirement. Meaning, it may be necessary to separately manufacture the thin metal heat releasing sheet in accordance with the specification of a product IC, etc.

Since the heat releasing sheet typically has a multi-layered structure, its manufacturing cost is increased, which in turn increases the manufacturing cost of the final product.

SUMMARY

Embodiments relate to a heat releasing semiconductor package, a method for manufacturing the same, and a display apparatus including the same that can protect the semiconductor package from an influence regarding the circuit stability due to heat.

Embodiments relate to a heat releasing semiconductor package, a method for manufacturing the same, and a display apparatus including the same that can lower a product price and be conveniently applied regardless of the layout of a drive IC.

Embodiments relate to a heat releasing semiconductor package, a method for manufacturing the same, and a display apparatus including the same that can be easily applied even to a product having an irregular surface.

In accordance with embodiments, a heat releasing semiconductor package may include at least one of the following: an electrode pattern formed on and/or over a film; a semiconductor device mounted on and/or over the electrode pattern; and a first heat releasing layer formed on and/or over the semiconductor device such that the first heat releasing layer includes an adhesive and a heat releasing paint, the first heat releasing layer being coated over the electrode pattern.

In accordance with embodiments, a heat releasing semiconductor package may include at least one of the following: an electrode pattern formed on and/or over a film; a semiconductor device mounted on and/or over the electrode pattern; and a second heat releasing layer formed below the film such that the second heat releasing layer includes an adhesive and a heat releasing paint, the second heat releasing layer being coated on and/or over the electrode pattern.

In accordance with embodiments, a method for manufacturing a heat releasing semiconductor package may include at least one of the following: forming an electrode pattern on and/or over a film; mounting a semiconductor device on and/or over the electrode pattern; and then forming a first heat releasing layer on and/or over the semiconductor device by coating the first heat releasing layer on and/or over the semiconductor device.

In accordance with embodiments, a method for manufacturing a heat releasing semiconductor package may include at least one of the following: forming an electrode pattern on and/or over a film; mounting a semiconductor device on and/or over the electrode pattern; and then forming a second heat releasing layer below the film by mixing an adhesive and a heat releasing paint and then coating the mixed adhesive and heat releasing paint.

In accordance with embodiments, a display apparatus including a heat releasing semiconductor package may include at least one of the following: a display panel; and a heat releasing semiconductor package electrically connected to the display panel.

DRAWINGS

Example FIGS. 1 to 7 illustrate a heat releasing semiconductor package, a method for manufacturing a heat releasing semiconductor package, and a spray nozzle for spraying a heat releasing paint in a method for manufacturing a heat releasing semiconductor package, in accordance with embodiments.

DESCRIPTION

Hereinafter, a heat releasing semiconductor package, a method for manufacturing the same, and a display apparatus including the same in accordance with embodiments will be described with reference to the accompanying drawings.

As illustrated in example FIG. 1A, heat releasing semiconductor package 100 in accordance with embodiment may include electrode pattern 20 formed on and/or over a film 10, semiconductor device 50 mounted on and/or over electrode pattern 20, and first heat releasing layer 90 formed on and/or over semiconductor device 50. Heat releasing semiconductor package 100 in accordance with embodiments may be used for releasing heat emitted from a drive IC mounted on and/or over a tape carrier package (TCP) or a chip on film (COF) equipped in an edge of a display panel main body employing a semiconductor device, such as a liquid crystal display (LCD), a plasma display panel (PDP), an organic light-emitting diode (OLED), a light emitting diode (LED), a radio frequency identification (RFID), etc.

In accordance with embodiments, first heat releasing layer 90 may be formed by coating liquid heat releasing paint on and/or over an entire surface or a portion of a surface of film 10 used in the TCP or COF, for example, a flexible printed circuit board (FPCB), and curing the coated liquid heat releasing paint. First heat releasing layer 90 may be a nonconductive heat releasing layer. For example, first heat releasing layer 90 may be coated and then cured after an adhesive and the heat releasing paint are mixed. In this case, since the adhesive is nonconductive, first heat releasing layer 90 may be a nonconductive heat releasing layer regardless of whether or not the heat releasing paint is conductive.

The heat releasing paint may indicate a heat releasing coating solution used when assembling a semiconductor package. The heat releasing paint may be an insulating material including an organic or inorganic coating material, such as ceramic, silicon, or the like, or a conductive material such as various metal pastes, carbon nano tube (CNT), graphite, or the like, or may include other compound coating paints.

Figure 1B:
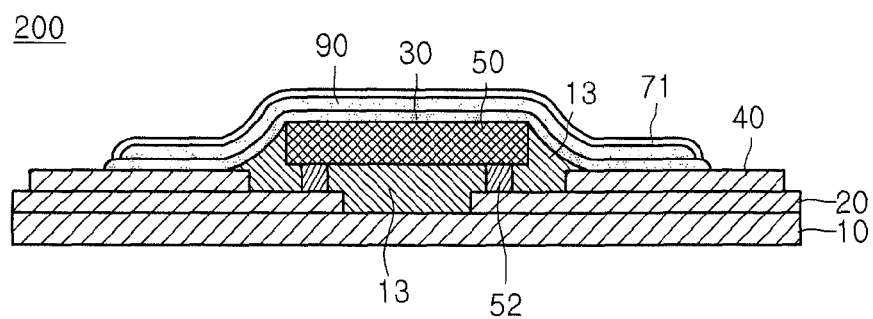

As illustrated in example FIG. 1B, heat releasing semiconductor package 200 in accordance with embodiments may further include first adhesive layer 30 formed on and/or over semiconductor device 50 to reinforce the adhesive function and the insulating function. Reference numerals not described in example FIGS. 1A and 1B will be described in a manufacturing method. First insulating layer 71 may be formed on and/or over first heat releasing layer 90 to reinforce the insulating function by additively coating an insulating paint. The insulating paint may be applied to a product having superior radiation and irradiation capability. First insulating layer 71 may be also formed on and/or over first heating releasing layer 90.

A display apparatus including the heat releasing semiconductor package may be a display apparatus employing a semiconductor device, an LCD, a PDP, an OLED, an LED, an RFID, and the like, and may include a display apparatus having a similar shape to be developed in future.

By the heat releasing semiconductor package in accordance with embodiments, since a heat releasing device can be added even on and/or over a portion where a typical heat releasing sheet or tape cannot be attached, heat releasing effect can be enhanced. The process can be simplified to thereby reduce manufacturing cost. The thickness of the heat releasing layer can be arbitrarily adjusted by controlling spray quantity and spray time of the heat releasing paint, so that unnecessary waste of materials can be removed. Moreover, since the manufacturing facility may be constituted by adding a nozzle spray apparatus to a typical packaging equipment, cost increase due to the addition of the nozzle spray apparatus is not great. Since the heat releasing layer is formed on and/or over the heat emitting device, heat generation reduction effect can be further increased.

Hereinafter, a method for manufacturing a heat releasing semiconductor package in accordance with embodiments will be described with reference to example FIGS. 2A to 2C.

While the embodiment shows and describes below that the heat releasing layer is formed for unit semiconductor device 50, the present disclosure is not limited thereto. For example, the heat releasing layer may be coated on and/or over a plurality of semiconductor devices arranged apart by a predetermined spacing from each other by using a plurality of nozzles.

Figure 2A:
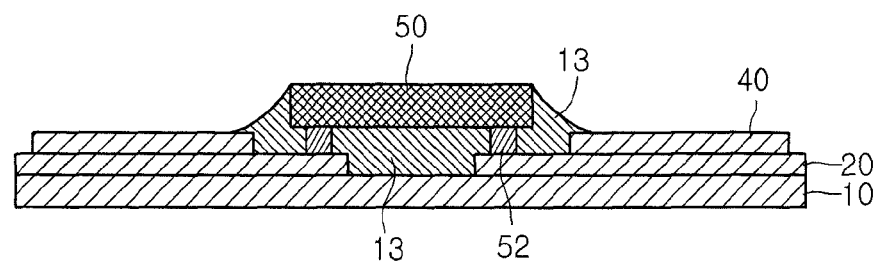

As illustrated in example FIG. 2A, electrode pattern 20 is formed on and/or over film 10. Film 10 may be a flexible printed circuit board (FPCB), but embodiments are not limited thereto. A supporting film may be further provided below film 10. Electrode pattern 20 may be formed in plurality so as to face one side surface and the other side surface. Electrode patterns 20 spaced apart from each other may function as an input pad and an output pad, respectively. The input pad may be electrically connected to a PCB substrate and the output pad may be electrically connected to a display panel. Thereafter, protective layer 40 may be formed on and/or over electrode pattern 20. For example, an insulating layer may be formed as protective layer 40, but embodiments are not limited thereto.

Thereafter, semiconductor device 50 is mounted on and/or over electrode pattern 20. For example, semiconductor device 50 may be mounted such that terminals 52 thereof directly contact the surface of electrode patterns 20, respectively. In a case where a clearance between semiconductor device 50 and film 10 is large, a filling process may be performed to form filler 13 prior to coating a heat releasing paint. In a case where first adhesive layer 30 process is performed as a subsequent process, first adhesive layer 30 may perform the function as the filler, or a separate filling process may be performed prior to or after the process of forming first adhesive layer 30.

Figure 2B:
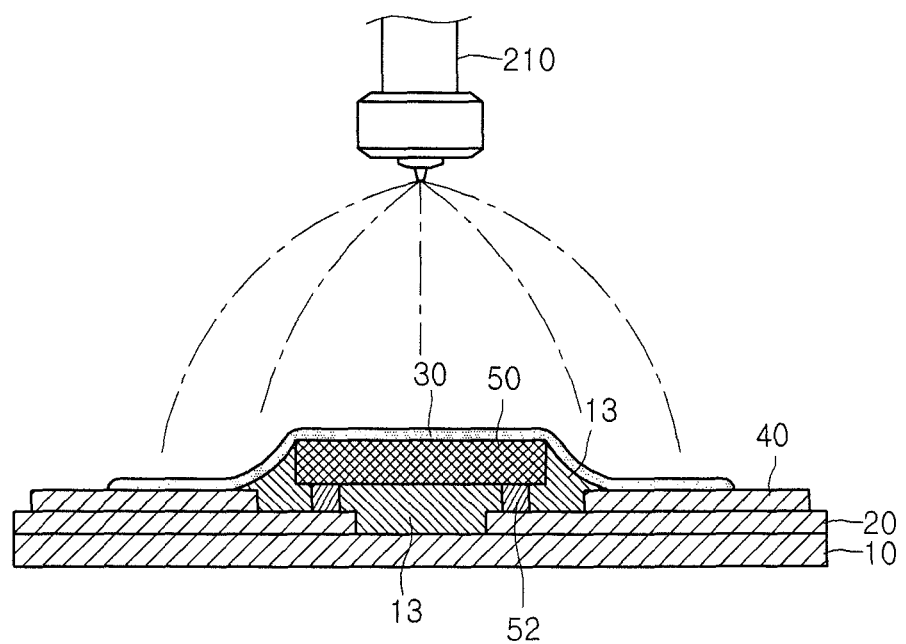

As illustrated in example FIG. 2B, a nonconductive liquid adhesive may be coated on and/or over an entire surface or a portion of a surface of film 10 used in the TCP or COF, thereby forming first adhesive layer 30. The adhesive may be an organic or inorganic compound, but embodiments are not limited thereto. In accordance with embodiments, by forming first adhesive layer 30, the adhesive function and the insulating function can be reinforced. First adhesive layer 30 may be coated in an area capable of completely covering semiconductor device 50. First adhesive layer 30 may be formed having a thickness in a range of between 1 μm to 100 μm, but embodiments are not limited thereto. The liquid adhesive may be uniformly coated by using first spray nozzle 210. The process of forming first adhesive layer 30 may not be performed. For example, in a case where first heat releasing layer 90 may combine a nonconductive heat releasing function and an adhesive function, the process of forming first adhesive layer 30 may be omitted.

First adhesive layer 30 is a subsidiary structure for rigidly attaching first heat releasing layer 90 on and/or over the surface of film 10. If, for example, first heat releasing layer 90 has a conductivity function and no adhesive function, first adhesive layer 30 may be formed to serve the adhesive function. There is a need that first adhesive layer 30 should be completely coated on and/or over a surface of an element targeted for heat releasing layer 90. In a state that the coating of first adhesive layer 30 is completely performed, when heat releasing layer 90 is applied or a coating region of first adhesive layer 30 does not correspond to a coating region of heat releasing layer 90, heat releasing layer 90 may be coated directly on and/or over the drive IC or the input/output terminal. If first heat releasing layer 90 has the conductivity, short danger may be generated.

In accordance with embodiments, pigment or fluorescent material may be added to the adhesive in order that a worker may visually confirm whether or not first adhesive layer 30 is coated. A color that can be apparently discriminated from the FPCB and the heat releasing paint may be selected.

Figure 2C:
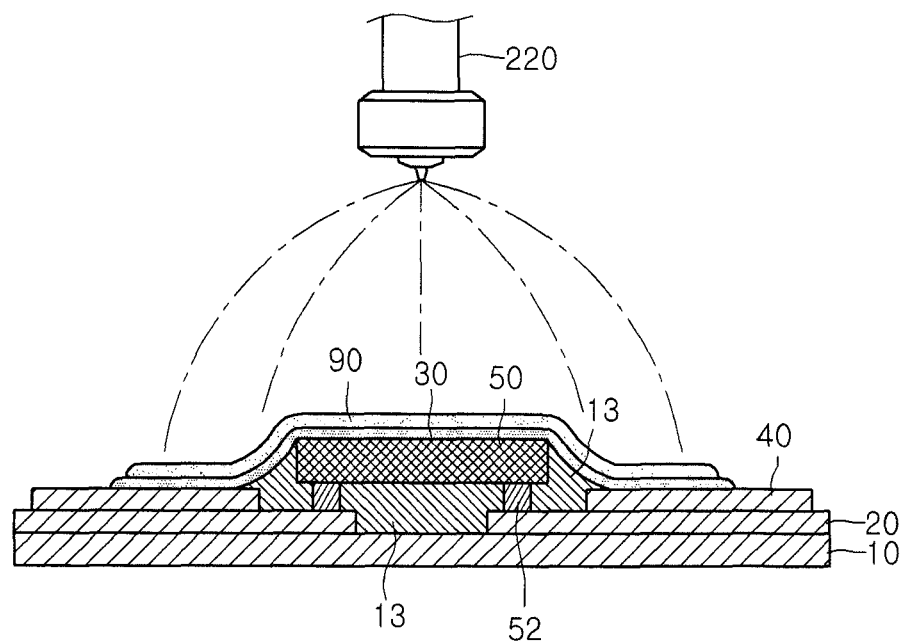

As illustrated in example FIG. 2C, first heat releasing layer 90 is formed on and/or over first adhesive layer 30 or semiconductor device 50. The step of forming first heat releasing layer 90 may be performed by coating the adhesive and the heat releasing paint together on and/or over first adhesive layer 30 or semiconductor device 50. For example, first heat releasing layer 90 may be formed by mixing liquid adhesive and heat releasing paint, coating the mixture on and/or over an entire surface or a portion of an uppermost surface of first adhesive layer 30, and then curing the coated mixture. As the curing method, a thermal curing, a UV curing, a room temperature curing, or the like may be used. For example, the curing may be performed using a UV light source or a thermal curing oven matched with a component of the heat releasing paint. For example, as the UV light source, a lamp-type and an LED type may be used, but embodiments are not limited thereto. The adhesive may be resin, for example, polyacrylates or the like, but embodiments are not limited thereto.

In accordance with embodiments, the heat releasing paint may include at least one of nonconductive material, conductive material, and a mixture of nonconductive material and conductive material. For example, the heat releasing paint may indicate a heat releasing coating solution used when assembling a semiconductor package. The heat releasing paint may be an insulating material including a ceramic filler such as aluminum/zinc oxide, and an organic/inorganic coating agent such as silicon, a conductive material such as various metal pastes, carbon nano tube (CNT), graphite, or the like, other compound coating paint, or a mixture of the insulating material and the conductive material. First heat releasing layer 90 may include about 5 wt % to 20 wt % of the adhesive, and about 80 wt % to 95 wt % of the heat releasing paint, but embodiments are not limited thereto. First heat releasing layer 90 may include an additive in addition to the adhesive and the heat releasing paint. For example, first heat releasing layer 90 may include about 5 wt % to about 15 wt % of the adhesive, about 80 wt % to about 90 wt % of the heat releasing paint, and about 5 wt % to about 15 wt % of the additive, but embodiments are not limited thereto.

The heat releasing paint may be injected and coated uniformly by second spray nozzle 220. The thickness of heat releasing layer 90 may be adjusted within a range of between 1 μm to 100 μm if necessary, but embodiments are not limited thereto. If necessary, the thickness of heat releasing layer 90 may be increased. First heat releasing layer 90 may be a conductive or nonconductive heat releasing layer. For example, first heat releasing layer 90 may be formed by mixing the adhesive and the heat releasing paint, coating the mixture and curing the coated mixture. Since the adhesive is nonconductive, first heat releasing layer 90 may be a nonconductive heat releasing layer regardless of the conductivity of the heat releasing paint. Therefore, formation of first adhesive layer 30 may be omitted. As the adhesive (binder) for forming first heat releasing layer 90, an organic or inorganic compound resin may be used like first adhesive layer 30, but embodiments are not limited thereto.

Figure 4:
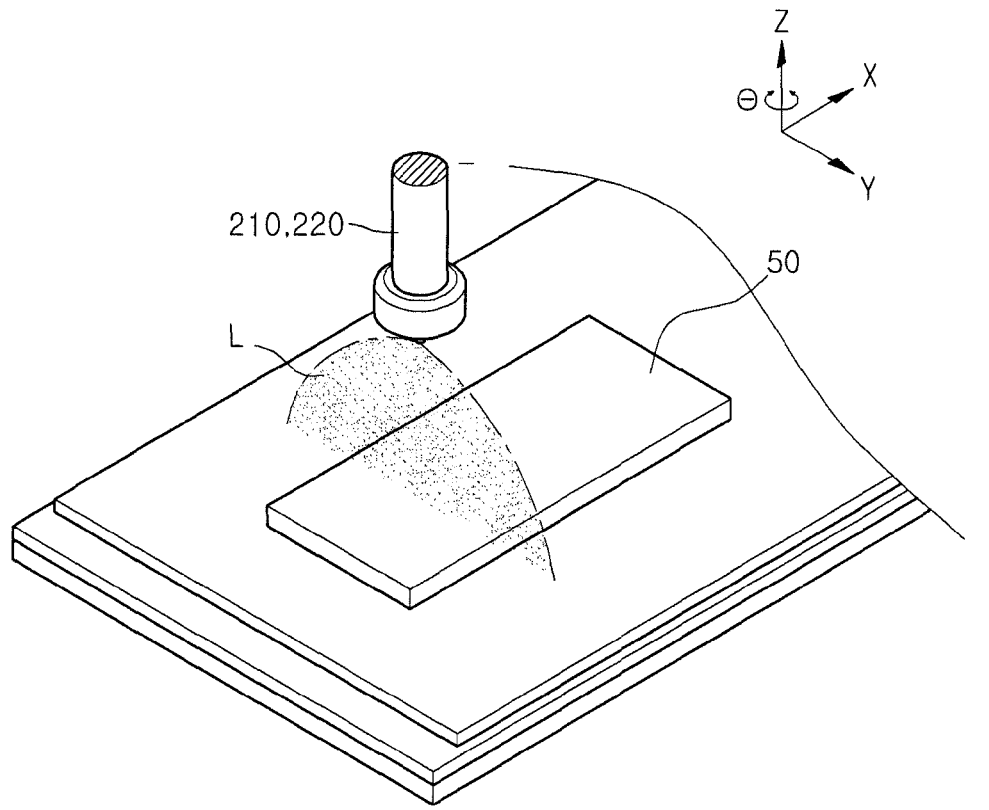

Example FIG. 4 illustrates a perspective view schematically illustrating a spray nozzle for spraying a heat releasing paint in a method for manufacturing a heat releasing semiconductor package in accordance with embodiments.

As illustrated in example FIG. 4, in a state that first spray nozzle 210 and second spray nozzle 220 are installed on and/or over or below film 10, first spray nozzle 210 and second spray nozzle 220 may inject the adhesive and the heat releasing paint respectively while being moved in a lateral and/or vertical direction using a moving/translation device. Information as to the area and position to coat the heat releasing paint on a targeted object may be input in advance, thereby making it possible to allow the moving/translation device to control movement of first and second spray nozzles 210, 220. First and second spray nozzles 210, 220 may move basically along a two-dimensional plane defined by an X-axis and a Y-axis, and if necessary, first and second spray nozzles 210, 220 may rotate about a θ-axis.

First and second spray nozzles 210, 220 may also move upward or downward along a Z-axis direction. The adhesive or heat releasing paint sprayed from first and second spray nozzles 210, 220 may be sprayed while being diffusing in a fan shape. An image sensor for identifying the position of film 10, for example, a CCD camera, may be employed to enhance the position accuracy.

In accordance with embodiments, a TCP/COF manufacturing equipment may be automated. In employing an apparatus for spraying adhesive and heat releasing paint intervening in mid-course of the TCP/COP process line, the heat releasing issue of the drive IC may be solved simply. The coating may be performed at a position needing a position detection in desired thickness, width and shape by a screen method, an ink-jet method, or the like using the spray apparatus. Moreover, using a spray makes it possible to perform a fine spraying, and thus, a wide area can be coated at one time. Since the coating is performed in a manner to spray heat releasing paint at a selected height without directly contacting a surface of the PCB substrate, the film, the semiconductor device, or the like, fail generation danger is reduced and product damage is minimal. Additionally, the coating can be uniformly performed with respect to a product having an irregular surface.

In accordance with embodiments, since a thermoelectric device system capable of managing temperature of heat releasing paint or the like can be implement in a constant pressure pump and a heat apparatus is built in the spray nozzle, the heat releasing paint can be controlled at a desired temperature, thereby efficiently managing the viscosity of the heat releasing paint. Also, since the heat releasing paint is coated, three heat releasing effects of radiation, conduction and convection can be maximized to show a heat releasing effect superior to a general heat releasing sheet.

By the heat releasing semiconductor package, the method for manufacturing the same, and the display apparatus including the same in accordance with embodiments, since heat releasing means can be applied even to a place where the general heat releasing sheet or tape cannot be attached, the heat releasing effect can be enhanced. Also, since the manufacturing process is simplified, manufacturing cost can be reduced. Since the spray quantity, spray time, and the like can be adjusted, it is possible to arbitrarily adjust the thickness of the heat releasing layer, thereby getting rid of unnecessary waste of material. Since the nozzle spray apparatus can be included in the typical packaging equipment to constitute an overall facility, cost increase due to the addition of the spray apparatus is not significant.

Figure 3A:
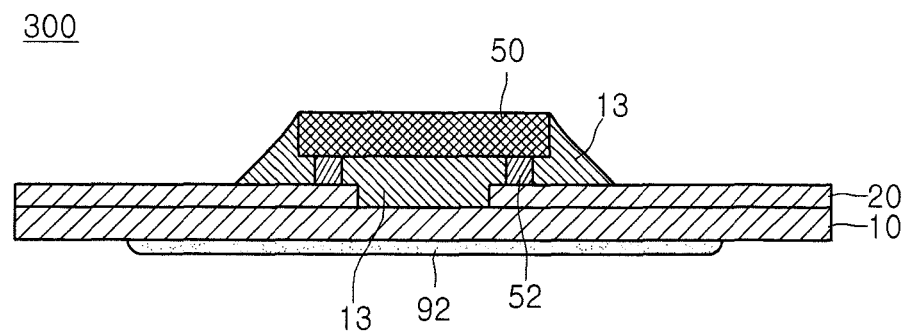

Example FIG. 3A illustrates a cross-sectional view of heat releasing semiconductor package 300 in accordance with embodiments. Embodiments illustrated in example FIG. 3A may employ the technical features of those previously described and illustrated. Second heat releasing layer 92, however, may be formed below film 10. Second heat releasing layer 92 may be formed by a coating process, like the process of forming first heat releasing layer 90. In order to reinforce the adhesive function, second heat releasing layer 92 may be formed after forming second adhesive layer 32.

Figure 3B:
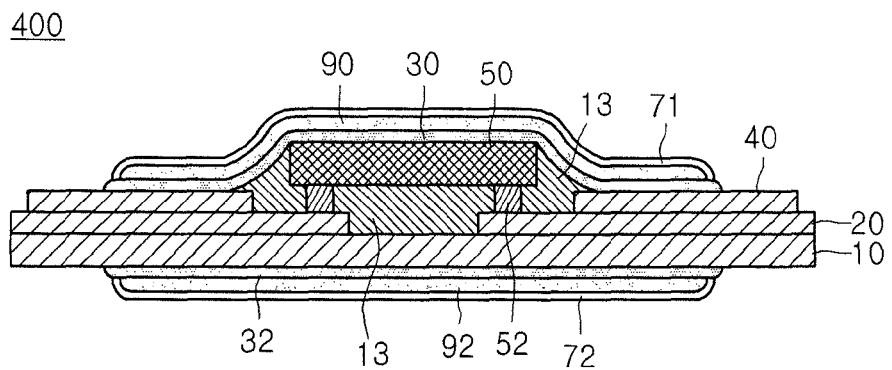

Example FIG. 3B illustrates a cross-sectional view of a heat releasing semiconductor package 400 in accordance with embodiments. Embodiments illustrated in example FIG. 3B may employ the technical features of the previously described and illustrate embodiment. The heat releasing function may be maximized by forming first heat releasing layer 90 on and/or over film 10. First adhesive layer 30 may be selectively formed. In order to reinforce the insulating function, an insulating paint may be additionally coated on and/or over second heat releasing layer 92 to form second insulating layer 72. The insulating paint may be a product having superior radiation and irradiation capability. In order to reinforce the insulating function, first insulating layer 71 may be formed on and/or over first heat releasing layer 90.

Figure 5:
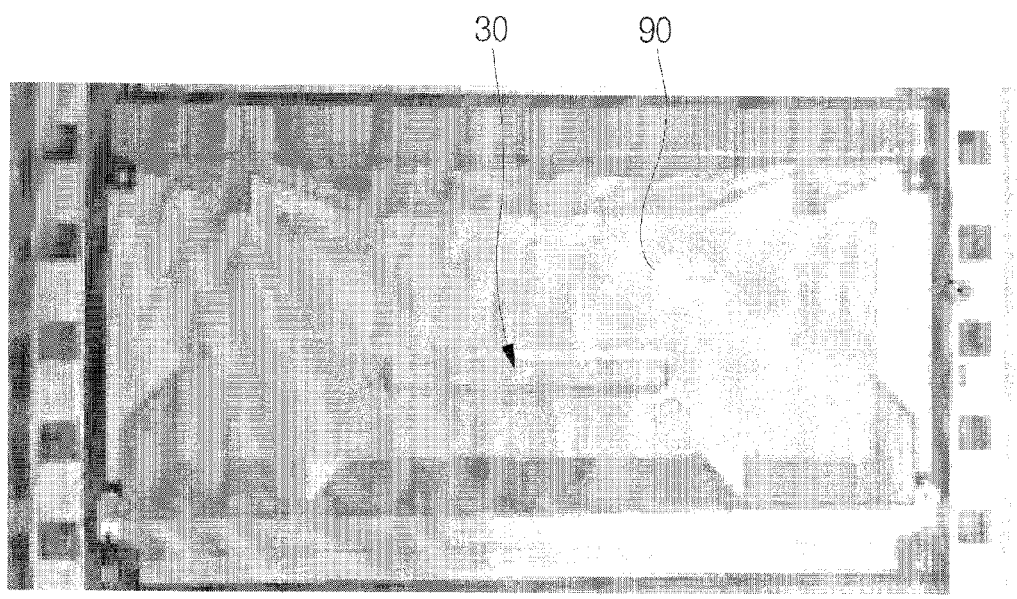

Example FIG. 5 illustrates a plane photograph of a heat releasing semiconductor package in accordance with embodiments.

As illustrated in example FIG. 5, it can be seen that semiconductor device 50 is mounted on and/or over film 10, and first heat releasing layer 90 is formed on and/or over semiconductor device 50.

Figure 6:
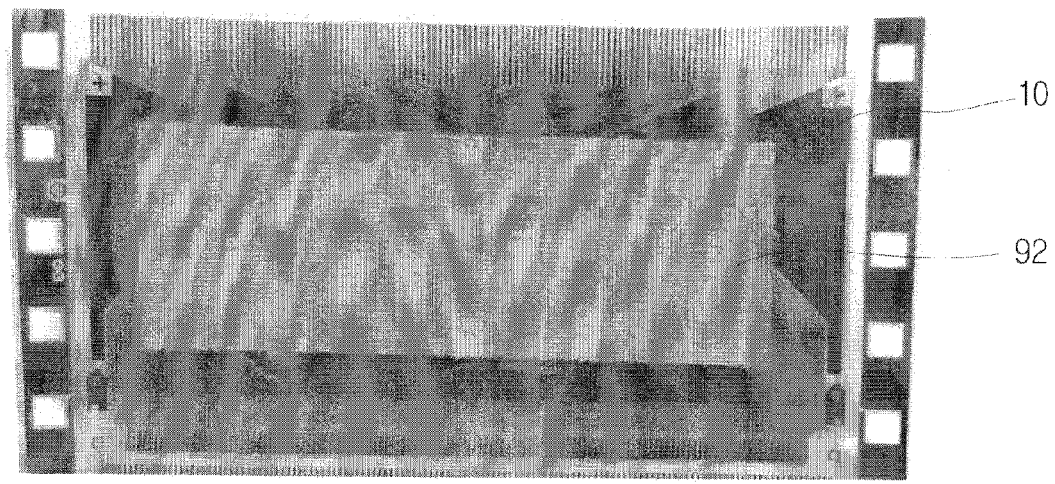

Example FIG. 6 illustrates a bottom photograph of a heat releasing semiconductor package in accordance with embodiments.

As illustrated in example FIG. 6, it can be seen that second heat releasing layer 92 is formed below film 10.

Figure 7:
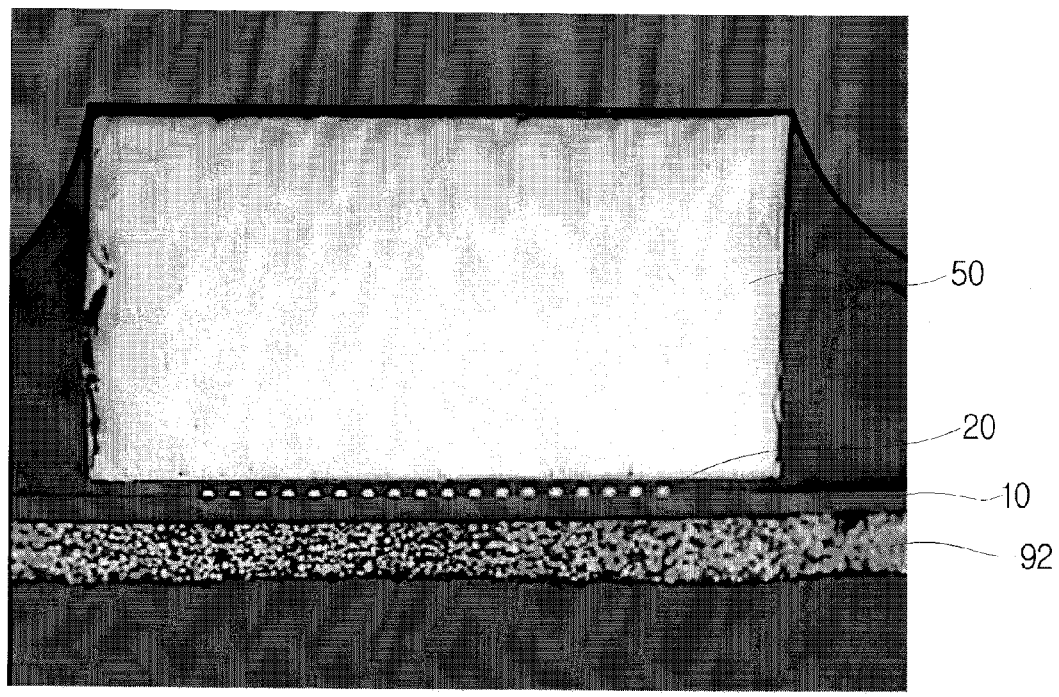

FIG. 7 is a cross-sectional photograph of a heat releasing semiconductor package in accordance with embodiments.

As illustrated in example FIG. 7, the sectional photograph of first heat releasing layer 90 may be equal to or similar to the sectional view of second heat releasing layer 92. It can be seen that second heat releasing layer 92 is formed below film 10 and semiconductor device 50 is formed on and/or over electrode pattern 20 including film 10. Particularly, a section of the heat releasing layer cured after the adhesive and the heat releasing paint are mixed and coated can be seen.

In Table 1, White indicates an example, which does not include a coloring, and Black indicates an example, which includes a coloring.

Test results show that when it is determined that the temperature decrease effect is 100% in the case of the comparative example (Reference 1) having the normal standard COF real measurement data, the heat releasing semiconductor package in accordance with embodiments has a temperature decrease effect close to about 20%. In Table 1, the temperature decrease effect of about 8.2% was obtained, but embodiments are not limited thereto.

TABLE 2

|  | Heating value | Temperature (° C.) | Emissivity | Thermal conduction rate (W/mk) | Coating size (mm) |
|---|---|---|---|---|---|
| Reference 2 | 0.25 | 147 | No | No | No |
| No 5 | 0.25 | 99 | 0.95 | 2.0 | 20 × 10 × 0.2 |
| No 6 | 0.25 | 103 | 0.95 | 1.2 | 25 × 15 × 0.2 |
| No 7 | 0.25 | 87 | 0.95 | 2.7 | 25 × 15 × 0.2 |

Table 2 shows another data measuring temperature decrease effect (No 5, No 6 and No 7) of heat releasing semiconductor packages according to a comparative example (Reference 2) and embodiments.

In accordance with embodiments, No 5, No 6 and No 7 have a little different component ratio of releasing paint respectively. The releasing paint of embodiments has 1.0 W/mk ~3.0 W/mk of Thermal conduction rate and the releasing paint has about 0.1 mm~about 0.2 mm of coating size, but embodiments are not limited thereto. When the temperature of a heating element is about 147° C., in embodiments, the temperature can be effectively decreased to about 87° C.

By the heat releasing semiconductor package, the method for manufacturing the same, and the display apparatus including the same in accordance with embodiments, since heat

TABLE 1

|  | Reference 1 | | No 1 | | No 2 | | No 3 | | No 4 | |
|---|---|---|---|---|---|---|---|---|---|---|
|  | RMV | D % | RMV | D % | RMV | D % | RMV | D % | RMV | D % |
| White | 69.1 | 100 | 64.2 | 92.9 | 63.7 | 92.2 | 63.9 | 92.5 | 63.5 | 91.9 |
| Black | 60.7 | 100 | 56.6 | 93.2 | 55.2 | 90.9 | 55.2 | 90.9 | 54.8 | 90.3 |
| White 1 hour aging | 76.5 | 100 | 70.8 | 92.5 | 70.1 | 91.6 | 69.8 | 91.2 | 69.6 | 91.0 |
| AVG (D %) |  | 100 |  | 92.9 |  | 91.6 |  | 91.6 |  | 91.1 |

*RMV: Real measurement value, D: Decrease rate

Table 1 shows data measuring temperature decrease effect (No 1, No 2, No 3, No 4) of heat releasing semiconductor packages in accordance with a comparative example (Reference 1) and embodiment. The data of Table 1 were obtained by attaching a heat releasing semiconductor package including a paste type heat releasing layer in accordance with embodiments on and/or over a panel PCB of a 32-inch LCD TV and performing an experiment. As a temperature decrease measuring apparatus, a non-contact type thermometer was used, the surrounding temperature was 24±1° C., and the aging time was about 1 hour. The semiconductor IC was spaced apart by about 10 cm from the temperature decrease measuring apparatus, and a time term of about 5 minutes per pattern was maintained.

releasing means can be applied even to a place where the related art heat releasing sheet or tape cannot be attached, the heat releasing effect can be enhanced. Also, since the manufacturing process is simplified, the manufacturing cost can be saved. Since the spray quantity, spray time, and the like can be adjusted, it is possible to arbitrarily adjust the thickness of the heat releasing layer, thereby getting rid of unnecessary waste of material. Moreover, since the nozzle spray apparatus can be included in the typical packaging equipment to constitute an overall facility, cost increase due to the addition of the spray apparatus is not significant. Also, since the heat releasing means is effectively added, the heat releasing effect can be enhanced.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of embodiments. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A heat releasing semiconductor package comprising:
    a film;
    an electrode pattern formed over the film;
    a semiconductor device mounted over the electrode pattern;
    a first heat releasing layer formed over the semiconductor device including the electrode pattern; and
    a first adhesive layer formed interposed between the semiconductor device and the first heat releasing layer,
    wherein the first heat releasing layer comprises an adhesive and a heat releasing material, and
    wherein the first heat releasing layer comprises a nonconductive heat releasing layer.

2. The heat releasing semiconductor package of claim 1, wherein the heat releasing material comprises at least one of a nonconductive material, a conductive material, and a mixture of the nonconductive material and the conductive material.

3. The heat releasing semiconductor package of claim 2, wherein in a case where the heat releasing material is the nonconductive material, the heat releasing material is at least one of an organic coating agent, an inorganic coating agent, and a compound coating material.

4. The heat releasing semiconductor package of claim 2, wherein in the case where the heat releasing material is the conductive material, the heat releasing material is at least one of a metal paste, a carbon nano tube (CNT), and a graphite.

5. The heat releasing semiconductor package of claim 1, wherein the first heat releasing layer comprises about 5 wt % to about 15 wt % of the adhesive, and about 80 wt % to about 95 wt % of the heat releasing material.

6. The heat releasing semiconductor package of claim 1, wherein the first heat releasing layer comprises an additive.

7. The heat releasing semiconductor package of claim 6, wherein the first heat releasing layer comprises about 5 wt % to about 15 wt % of the adhesive, about 80 wt % to about 90 wt % of the heat releasing material, and about 5 wt % to about 15 wt % of the additive.

8. The heat releasing semiconductor package of claim 1, comprising:
    a first insulating layer formed over the first heat releasing layer.

9. A heat releasing semiconductor package comprising:
    a film;
    an electrode pattern formed over the film;
    a semiconductor device mounted over the electrode pattern;
    a first heat releasing layer over the semiconductor device including the electrode pattern, wherein the first heat releasing layer comprises an adhesive and a first heat releasing material and wherein the first heat releasing material comprises a nonconductive material;
    a second heat releasing layer formed under the film; and
    a first adhesive layer formed interposed between the semiconductor device and the first heat releasing layer,
    wherein the second heat releasing layer comprises an adhesive and a second heat releasing material.

10. The heat releasing semiconductor package of claim 9, wherein the second heat releasing material comprises a conductive material.

11. The heat releasing semiconductor package of claim 9, wherein the first heat releasing layer comprises about 5 wt % to about 20 wt % of the adhesive, and about 80 wt % to about 95 wt % of the heat releasing material.

12. The heat releasing semiconductor package of claim 9, wherein the first heat releasing layer comprises an additive.

13. The heat releasing semiconductor package of claim 12, wherein the first heat releasing layer comprises about 5 wt % to about 15 wt % of the adhesive, about 80 wt % to about 90 wt % of the heat releasing material, and about 5 wt % to about 15 wt % of the additive.

14. The heat releasing semiconductor package of claim 9, comprising:
    a first insulating layer formed over the first heat releasing layer.

15. A display apparatus comprising:
    a display panel; and
    a heat releasing semiconductor package electrically connected to the display panel, the heat releasing semiconductor package comprising a film, an electrode pattern formed over the film, a semiconductor device mounted over the electrode pattern, and a first heat releasing layer formed over the semiconductor device including the electrode pattern, and a first adhesive layer formed interposed between the semiconductor device and the first heat releasing layer,
    wherein the first heat releasing layer comprises a first adhesive and a first heat releasing material, and
    wherein the first heat releasing layer comprises a nonconductive heat releasing layer.

16. The display device of claim 15, comprising:
    a second heat releasing layer formed under the film,
    wherein the second heat releasing layer comprises a second adhesive and a second heat releasing material.

* * * * *